United States Patent [19]

Pauza et al.

[11] 3,865,458

[45] Feb. 11, 1975

[54] CIRCUIT PANEL CONNECTOR

[75] Inventors: William Vito Pauza; Edward Michael Poltonavage, both of Palmyra, Pa.

[73] Assignee: AMP Inc., Harrisburg, Pa.

[22] Filed: June 20, 1973

[21] Appl. No.: 371,806

Related U.S. Application Data

[62] Division of Ser. No. 158,778, July 1, 1971, Pat. No. 3,754,203.

[52] U.S. Cl. .............................................. 339/91 R

[51] Int. Cl. .............................................. H01r 13/54

[58] Field of Search ........... 339/17 C, 17 CF, 75 M, 339/75 MP, 174, 176 M, 176 MP, 176 MF, 339/91; 174/DIG. 3

[56] References Cited

UNITED STATES PATENTS

| | | | |
|---|---|---|---|
| 3,290,636 | 12/1966 | Overtveld | 339/17 CF UX |
| 3,409,857 | 11/1968 | O'Neill et al. | 339/17 CF |
| 3,409,861 | 11/1968 | Barnes et al. | 339/17 CF X |
| 3,417,362 | 12/1968 | Reynolds | 339/17 C |
| 3,500,288 | 3/1970 | Startin | 339/17 C |
| 3,529,277 | 9/1970 | Barnes | 339/174 X |
| 3,638,033 | 1/1972 | Johnson et al. | 339/75 MP X |
| 3,670,290 | 6/1972 | Angele et al. | 339/75 MP |
| 3,678,385 | 7/1972 | Bruner | 339/17 CF X |
| 3,700,788 | 10/1972 | Spurck | 339/17 CF X |
| 3,701,071 | 10/1972 | Landman | 339/176 MP X |
| 3,710,299 | 1/1973 | Weisenburger | 339/17 CF |

FOREIGN PATENTS OR APPLICATIONS

| | | | |
|---|---|---|---|
| 1,528,075 | 4/1968 | France | 174/DIG. 3 |

OTHER PUBLICATIONS

Boehm et al., "Bolted-Down Module, Etc." Burndy Data Sheet HSSB, 8-1963.

*Primary Examiner*—Roy D. Frazier
*Assistant Examiner*—Lawrence J. Staab
*Attorney, Agent, or Firm*—Fredrick W. Raring; Jay L. Seitchik; William J. Keating

[57] ABSTRACT

A connector for connecting external circuitry to terminal pads of a thin plate-like sub-strate comprises a generally prismatic housing having terminals extending therethrough from one face to the other face. The one face has a centrally located substrate receiving zone thereon and the terminals, which extend along opposite sides of the zone, have resilient cantilever arms which contact the pads. The substrate is held in the zone by securing means on the housing.

4 Claims, 10 Drawing Figures

CIRCUIT PANEL CONNECTOR

BACKGROUND OF THE INVENTION

This application is a division of application Ser. No. 158,778 filed July 1, 1971 and now U.S. Pat. No. 3,754,203.

The invention is for use in the electronics field for connecting integrated circuitry on ceramic substrates or MOS circuitry to printed circuit boards or other external circuitry. In the prior art the practice has been to attach a lead frame comprising a number of leads equal to the number of circuits on the substrate to be terminated. The lead frame is attached by metal joining methods brazing, thermocompression bending, or soldering each lead to its respective circuit pad and then trimming away the excess metal frame structure. Generally the leads are then bent at right angles to facilitate plugging into a header or directly into a printed circuit board or the like. This soldering and trimming operation greatly adds to the manufacturing costs of the integrated circuit package.

OBJECTS OF THE INVENTION

It is one object of the invention to provide an inexpensive connector assembly for terminating MOS circuitry to printed circuit boards or other external circuitry.

It is another object of the invention to provide a connector assembly for terminating MOS circuitry wherein the ceramic substrate may be removably snapped into position on the connector.

It is still a further object of the invention to provide a novel terminal for use in a header wherein the terminal has a spring contact for electrically engaging MOS integrated circuitry.

BRIEF SUMMARY OF THE INVENTION

The above objects of the invention are satisfied by providing a header of dielectric material having parallel rows of passageways extending therethrough. Each passageway is designed to receive an elongated electrical terminal having a general channel shape comprising a bottom wall and two opposed substantially parallel sidewalls extending therefrom. The bottom wall has struck therefrom a spring contact member which extends between and beyond the two sidewalls. The contact portion electrically engages a respective circuit pad on the substrate and an extension of one end of the terminal is designed to be terminated to external circuitry such as a printed circuit board, individual wire conductors, or the like.

Other objects and attainments of the present invention will become apparent to those skilled in the art upon a reading of the following detailed description when taken in conjunction with the drawings in which there are shown and described illustrative embodiments of the invention; it is to be understood, however, that these embodiments are not intended to be exhaustive nor limiting of the invention but are given for purposes of illustration in order that others skilled in the art may fully understand the invention and the principles thereof and the manner of applying it in practical use so that they may modify it in various forms, each as may be best suited to the conditions of a particular use.

BRIEF DESCRIPTION OF THE DRAWINGS

FIG. 2 is a section view taken along line 2—2 of FIG. 1 showing terminals secured in the header, the ceramic substrate prior to connection with the header and the printed circuit board to be terminated to;

FIG. 3 is a section view similar to FIG. 2 but showing the header with substrate attached and terminals terminated to a printed circuit board;

FIG. 9 is an exploded perspective view of a different embodiment of the invention.

DESCRIPTION OF THE INVENTION

Figure 1:
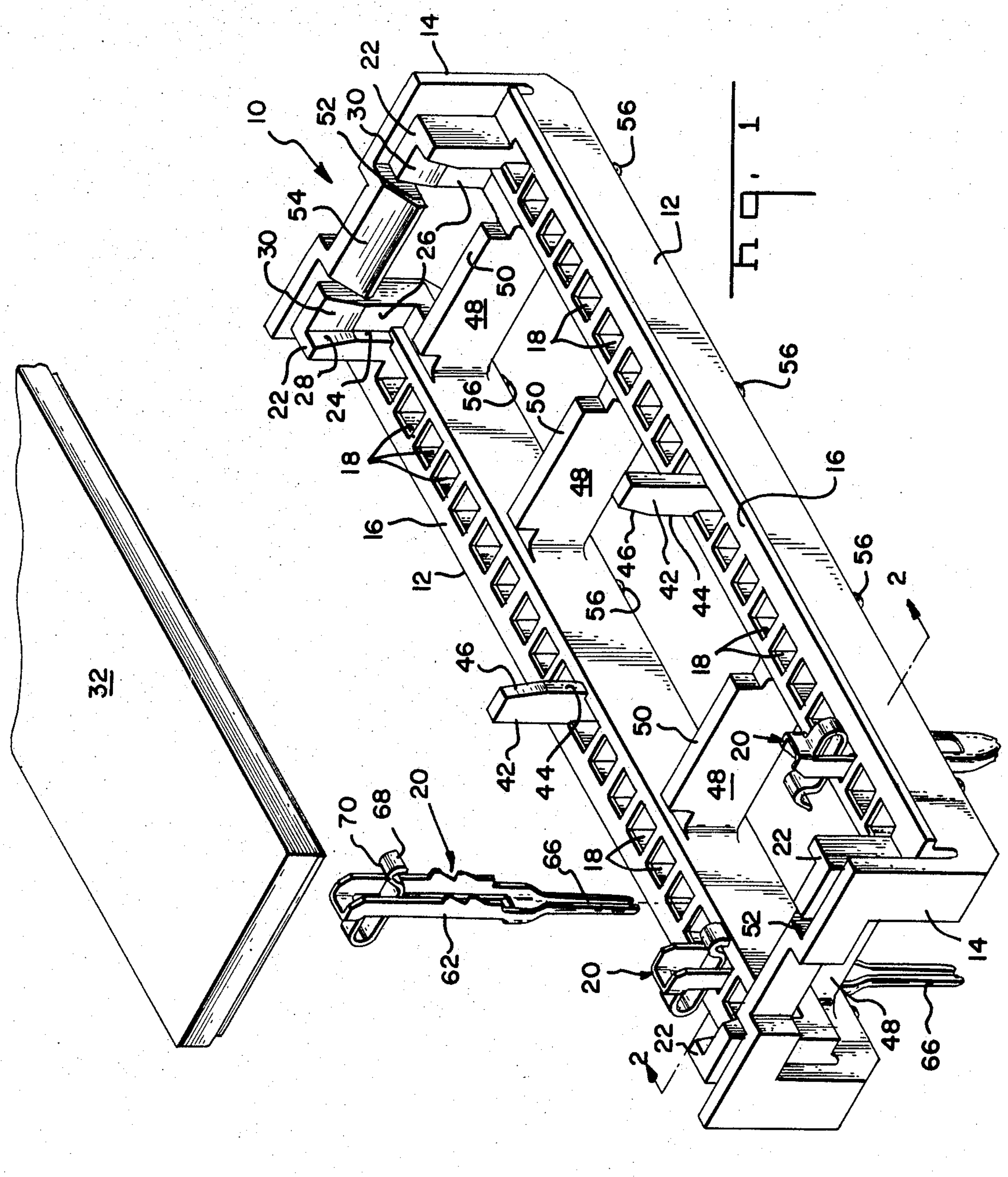
FIG. 1 is a perspective view of a connector employing the teachings of the present invention.

In FIG. 1 there is shown an illustrative embodiment of the invention wherein a header 10 is depicted. The header is of a suitable dielectric material such as Polycarbonate or glass filled nylon. The header 10 has a generally rectangular shape comprising elongated side members or rails 12 and shorter end members or rails 14 which extend above the top face or side 16 of header 10. Each side member has a plurality of passageways 18 therethrough designed to receive therein an electrical terminal 20.

At each end of each side member is a vertically upstanding corner guide 22 each having a side face 24 and an end face 26, respectively, and having beveled lead-in faces or aprons 28, 30. These corner guides accurately locate on the header the ceramic substrate 32.

Figure 5:
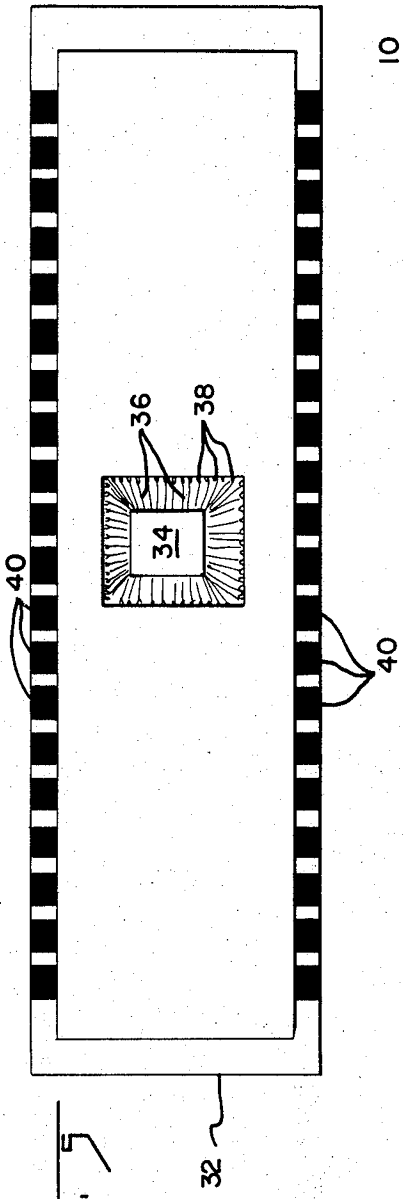
FIG. 5 is a plan view of one form of an MOS circuitry arrangement.

Substrate 32, as more clearly seen in FIG. 5, is typical of MOS circuitry and has located thereon a forty lead integrated circuit chip 34. The circuitry of the chip is direct or wire bonded, as indicated at 36 to respective leads 38 which terminate as contact pads 40 located at opposite edge surfaces of the substrate. It is, of course, envisioned that variously configured substrates having varied circuitry thereon are included in the inventive concept for use with appropriately configured header and terminal combinations.

Additional guides 42 accurately maintain the opposite edges of substrate 32 in appropriate alignment and include guide faces 44 each having a beveled lead-in 46. Bridging or joining each side member 12 are support members 48 each including a top surface 50 which, as better seen in FIGS. 3 and 4, prevents the substrate from putting undue strain on the terminals 20. Each end member 14 is attached to and integral with each side member 12 in a cantilever fashion. Although both members 14 have been disclosed as being flexibly mounted, in practice only one member 14 need be flexible. Each end member includes a snap catch 52 including a beveled lead-in face 54. As the substrate is forced down against the faces 54 each end member is flexed outwardly until the end edges of the substrate pass by the snap catch 52 which then snaps over the edges to retain the substrate in position as seen in FIG. 4.

Figures 2, 3:
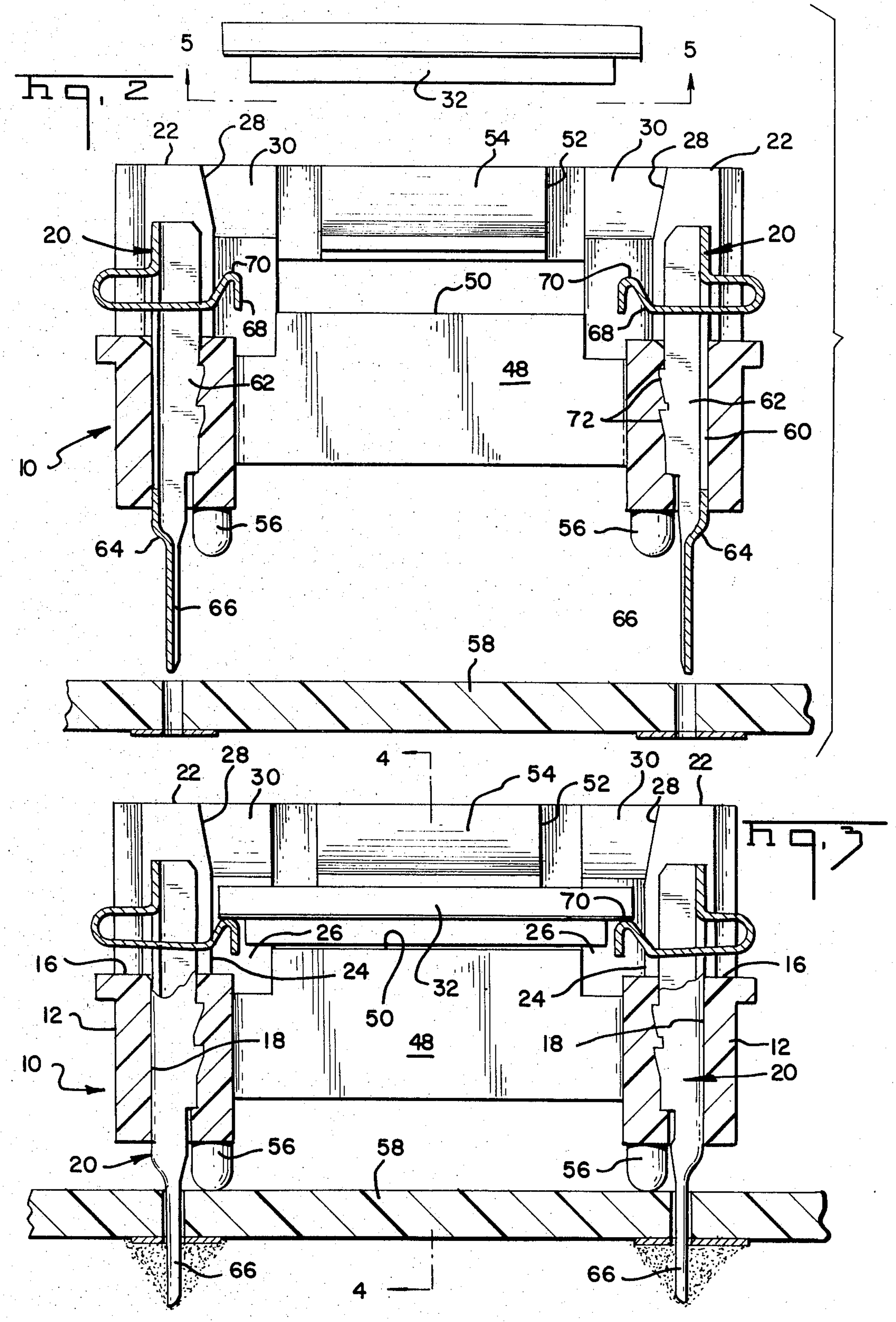
Figure 4:
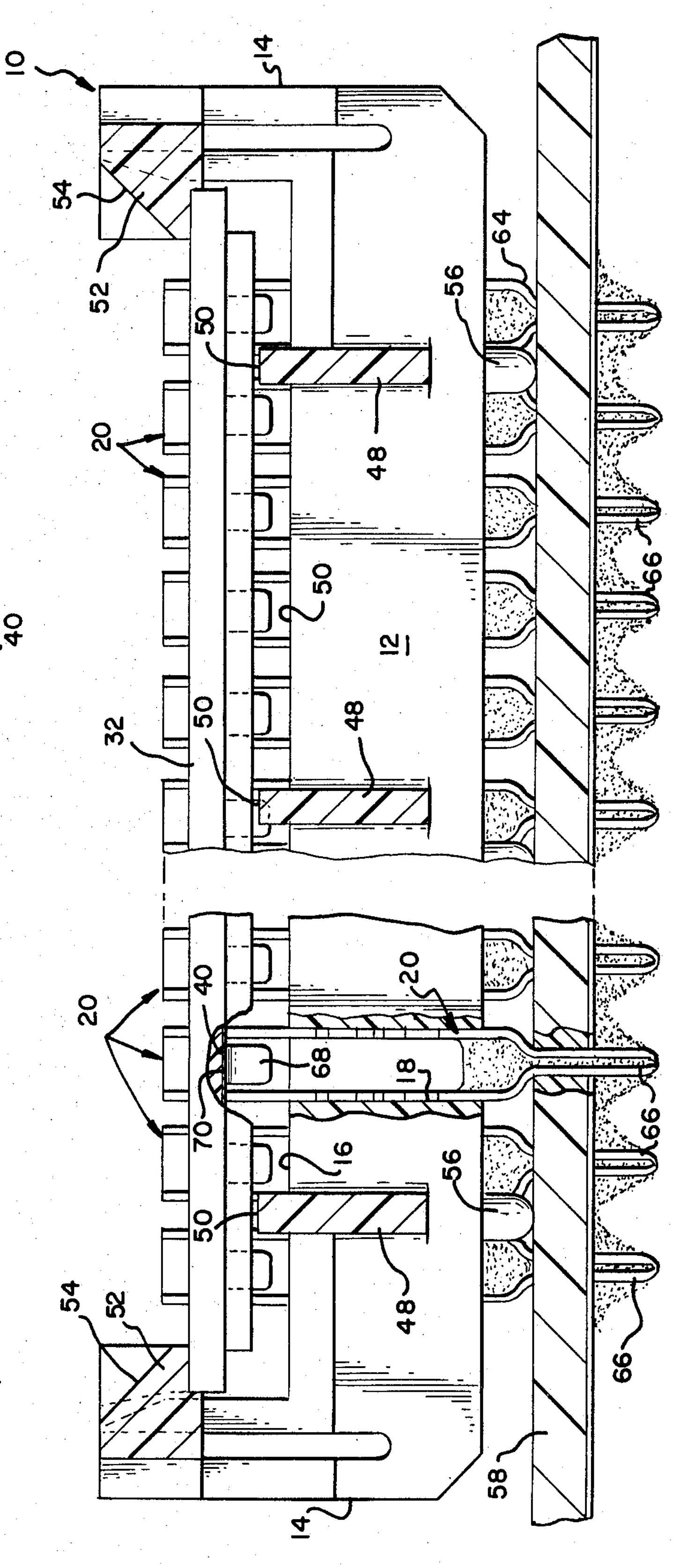
FIG. 4 is a sectional view along line 4—4 of FIG. 3 and partially fragmentary showing the substrate secured to the header and terminal with terminals plugged into a printed circuit board and soldered to circuitry thereon.

Positioned along the underside of each side member 12 are standoffs 56 which, as seen more clearly in FIGS. 3 and 4, function to maintain clearance between the header 10 and printed circuit board 58, which receives the terminals 20.

Figures 6, 7, 8:
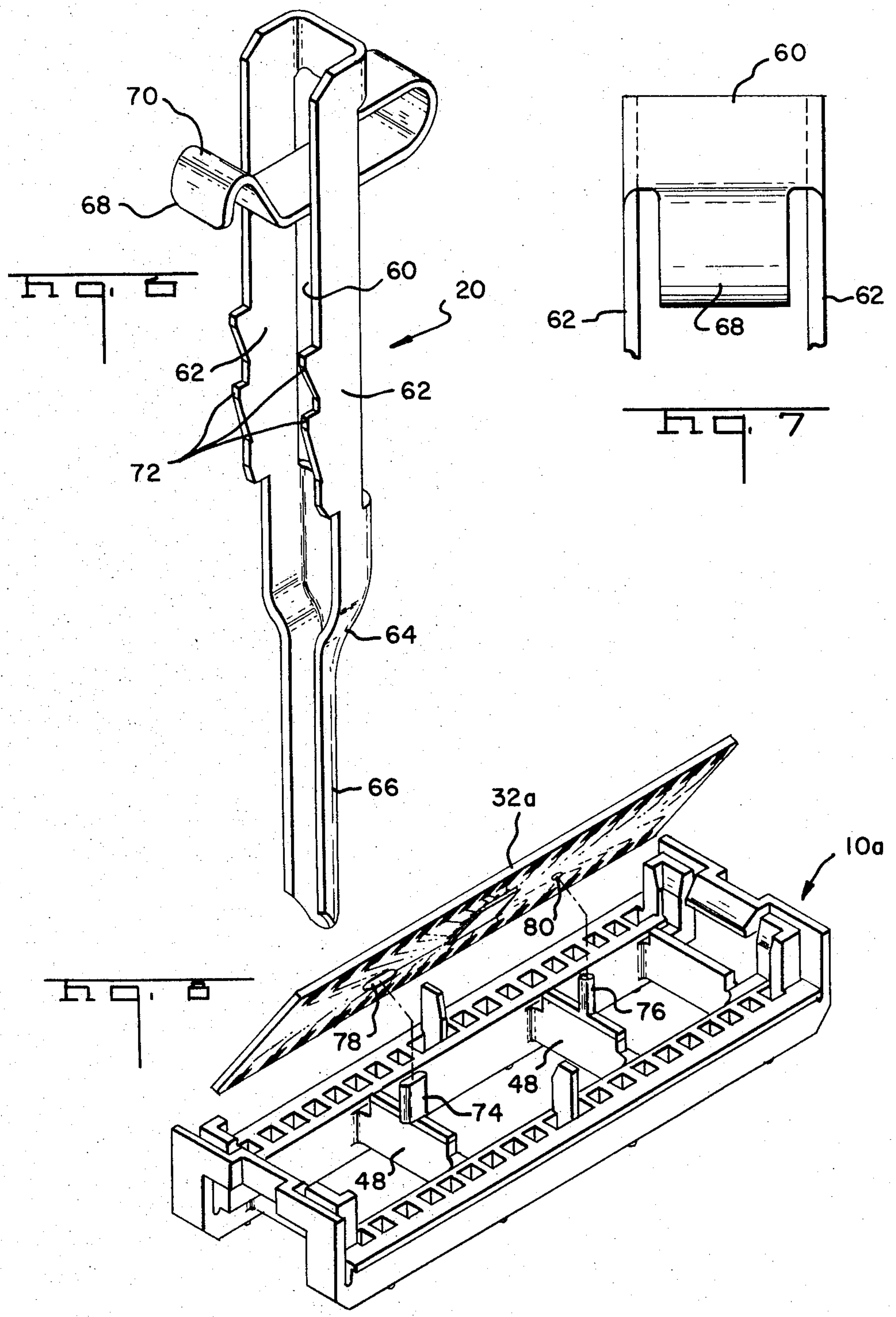
FIG. 6 is a perspective view of a terminal employing the teachings of the present invention.
FIG. 7 is a partial plan view of the upper portion of the terminal taken along line 7—7 of FIG. 6.
FIG. 8 is a perspective view showing modified forms of a header and ceramic substrate.

FIG. 6 illustrates the terminal 20 used in conjunction with header 10 and substrate 32. Terminal 20 is of an elongate generally channel shaped configuration having a bottom wall 60 and opposing sidewalls 62 extending generally normally therefrom. The channel shape of the terminal narrows down as at 64 into a solder post 66. It should be noted that solder post 66 could be adapted for receiving the end of a wire conductor wrapped therearound or adapted for other modes of termination techniques consistent with the invention. At the opposite or upper end of the terminal 20 from post 66 is a spring contact finger 68 including a contact face or area 70 for making electrical contact with a respective contact pad 40 located on substrate 32. This spring contact finger is formed out of the bottom wall 60 and with the reversely bent configuration shown the desired spring characteristics are achieved. Located on the outer edges of walls 62 are serrations or teeth 72 the purpose of which is to provide a friction fit for the terminal 20 when it is inserted into its respective passageway 18. After insertion the serrations or teeth will resist expulsion of the terminals such as when plugging the header with terminals into circuit board 58.

FIG. 8 shows a slightly modified header 10a having the provision for orienting a substrate. For this purpose posts 74 and 76, being respectively, oblong and cylindrical, are integral with two support members 48. A substrate 32a to be used with a header **10*a* is suitably configured with recesses or holes 78, 80 respectively. In other details the header 10*a* is identical with header 10.**

Figures 7, 10:
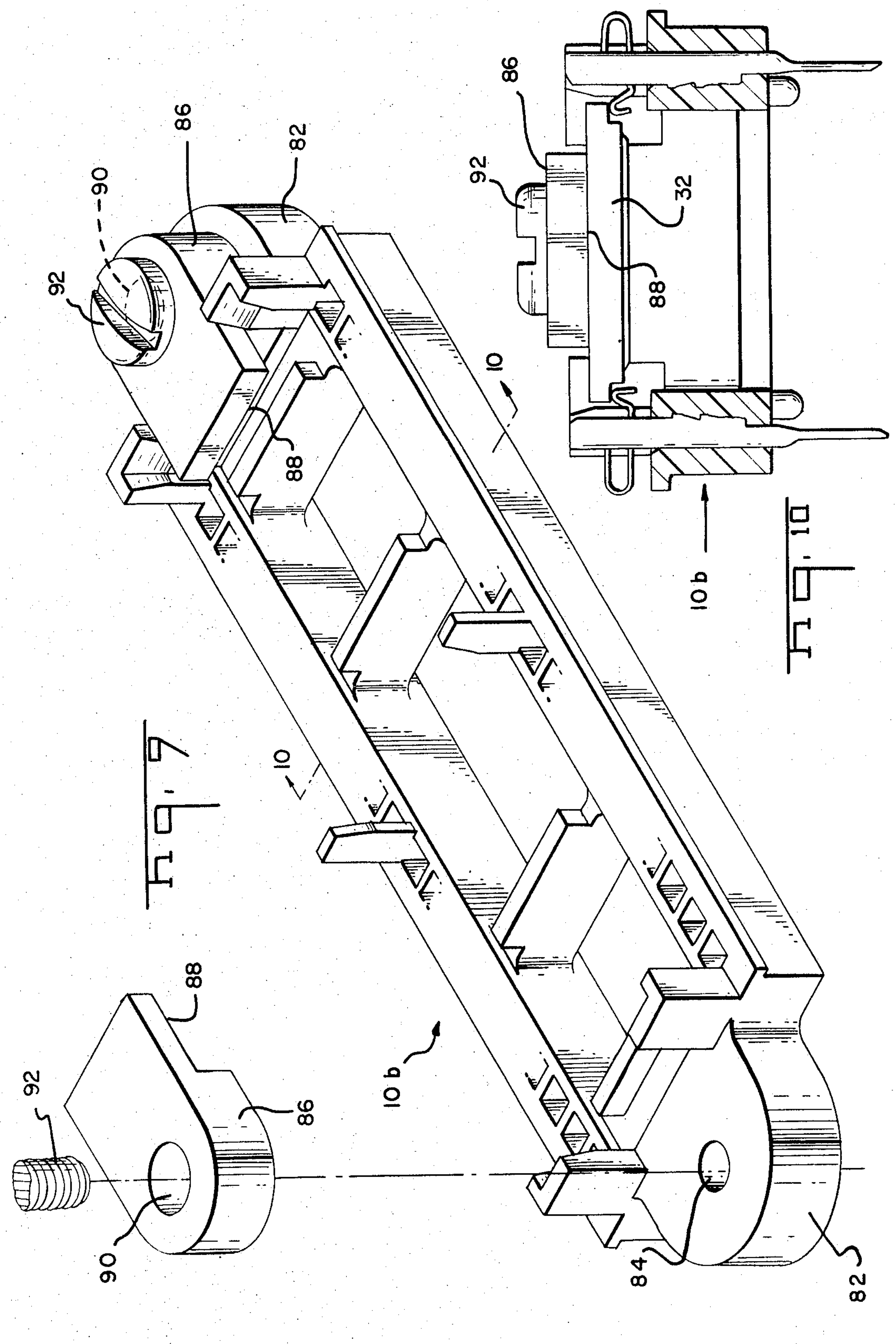
FIG. 10 is a section view taken along line 10—10 of FIG. 9.

FIGS. 9 and 10 depict a header **10*b* wherein like members indicate like parts with header 10. Header 10*b* in place of the end members 14 of header 10, has end members 82 each of which comprise a block having holes 84 therein. Locking blocks 86 including lips 88 and holes 90 which align with respective holes 84 are designed to cooperate with end members 82 to secure the substrate 32 in place. Securing is accomplished by screw 92** or any other suitable means and contact pressure on the terminal contact fingers may be adjustable.

It will, therefore, be appreciated that the aforementioned and other desirable objects having been achieved; however, it should be emphasized that the particular embodiments of the invention, which are shown and described herein, are intended as merely illustrative and not as restrictive of the invention.

What is claimed is:

1. An electrical connector for connecting external circuitry to terminal pads located along two opposite, generally parallel marginal edge portions of one face of a thin plate-like substrate, said connector comprising:

an insulating housing having on at one face thereof a centrally located substrate-receiving zone adapted to receive said substrate upon movement thereof normally of its plane and into said zone, a plurality of electrical contact terminals mounted in, and extending through, said housing, said terminals being arranged in lines extending along two opposite sides of said substrate-receiving zone with spacings between adjacent terminals corresponding to the spacings between said terminal pads, and having end portions positioned adjacent said zone, each of said terminals having on its end portion a resilient cantilever arm extending laterally into said substrate-receiving zone in a position to engage one of said terminal pads on a substrate therein, said end portions of said terminals being generally channel-shaped with their upper end portions extending beyond, and generally perpendicularly of said substrate-receiving zone, said cantilever arms being struck from the bottom walls of said channels, each of said cantilever arms extending from said upper end portion of its respective terminal first laterally away from said substrate-receiving zone and then back through the opening formed in the bottom wall by striking out said arm, each of said arms then extending beyond its respective channel and toward said substrate-receiving zone, means on said housing for securing said substrate in said substrate-receiving zone with said terminal pads in resiliently compressive contact with said cantilever arms, and connecting means on said terminals extending beyond the opposite face of said housing for forming electrical connections with said external circuitry.

2. An electrical connector as set forth in claim 1 wherein the edges of the side walls of said terminals are serrated to provide a friction fit with the walls of passageways extending through said housing.

3. An electrical connector for connecting external circuitry to terminal pads located on one face of a thin rectangular substrate, said terminal pads being arranged in two parallel rows which extend along marginal opposed side portions of said substrate, said connector comprising:

an open rectangular housing frame having parallel spaced-apart side rails and end rails extending between, and connecting, the ends of said side rails, said side rails being spaced apart by a distance which is substantially equal to, and slightly greater than, the width of said substrate as measured between said side pads, a plurality of electrical contact terminals mounted in, and extending through, said side rails, said terminals being spaced apart in each of said side rails by distances corresponding to the spacing between said terminal pads, said terminals having first end portions extending beyond one face of said frame, said first end portions defining a substrate receiving zone, each of said terminals having on said first end portion a resilient cantilever arm extending inwardly of said frame and into said substrate receiving zone for engagement with one of said terminal pads, each of said terminals having connecting means extending beyond the other face thereof for forming electrical connections with said external circuitry, substrate holding means on said end rails for engagement with end portions of said substrate to hold said substrate in said zone with said terminal pads in engagement with said cantilever arms, and locating means on said side rails for locating said substrate in said substrate receiving zone with said pads in contact with said cantilever arms, said locating means being engageable with edges portions of said substrate whereby, upon placement of said substrate in said zone and engagement of said holding means with said substrate, said terminal pads will be connected to said contact terminals and to said external circuitry by means of said connecting means.

4. An electrical connector as set forth in claim 3, said first end portion of each of said terminals being channel-shaped in cross-section, said resilient cantilever arm being struck from the base of the channel of each of said terminals.

* * * * *